United States Patent
Lee

(10) Patent No.: US 7,031,190 B2
(45) Date of Patent: Apr. 18, 2006

(54) STRUCTURE FOR TESTING NAND FLASH MEMORY AND METHOD OF TESTING NAND FLASH MEMORY

(75) Inventor: Keun Woo Lee, Kyungki-Do (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 180 days.

(21) Appl. No.: 10/737,571

(22) Filed: Dec. 16, 2003

(65) Prior Publication Data
US 2004/0190338 A1    Sep. 30, 2004

(30) Foreign Application Priority Data
Mar. 28, 2003   (KR) ...................... 10-2003-0019451

(51) Int. Cl.
*G11C 16/04*       (2006.01)
(52) U.S. Cl. ..................... 365/185.17; 365/185.05; 365/201
(58) Field of Classification Search ....... 365/185.05 X, 365/185.17 O, 201 X
See application file for complete search history.

(56) References Cited
U.S. PATENT DOCUMENTS

| 6,175,523 B1 * | 1/2001 | Yang et al. ............. 365/185.25 |
| 6,240,020 B1 * | 5/2001 | Yang et al. ............. 365/185.25 |
| 6,252,800 B1 * | 6/2001 | Chida .................... 365/185.11 |

* cited by examiner

*Primary Examiner*—VanThu Nguyen
(74) *Attorney, Agent, or Firm*—Marshall, Gerstein & Borun LLP

(57) ABSTRACT

Provided is a structure for testing a NAND flash memory including a first string select transistor for controlling transfer of a voltage inputted via a first bit line; a first string having a plurality of flash memory cells, connected between the first string select transistor and a first source select transistor, and maintaining a program or erase state depending on a voltage inputted thereto; a second string select transistor for controlling transfer of a voltage inputted via a second bit line; a second string having a plurality of flash memory cells, connected between the second string select transistor and a second source select transistor, and maintaining the program or erase state depending on a voltage inputted thereto; and a measurement pad connected to a point where the first or second string select transistor and the flash memory cell are connected.

10 Claims, 10 Drawing Sheets

STRUCTURE FOR TESTING NAND FLASH MEMORY AND METHOD OF TESTING NAND FLASH MEMORY

BACKGROUND

1. Field of the Invention

The present invention relates to a structure for testing a NAND flash memory and a method of measuring a channel voltage of the NAND flash memory using the same and, more particularly, to a structure for testing a NAND flash memory having a structure capable of measuring a channel voltage, and a method of measuring the channel voltage of the NAND flash memory using the same.

2. Discussion of Related Art

Recently, there is an increasing demand for semiconductor memory devices that are electrically programmed and erased and on which data can be stored without being erased even in a state where the power is not supplied. Further, in order to develop a large-capacity memory device capable of storing a large quantity of data, a high-integration technology of the memory cell has been developed. For this, there was proposed a NAND type flash memory device in which a plurality of memory cells are serially connected to form a single string and a plurality of the strings constitute a single memory cell array.

The flash memory cells of the NAND flash memory device include a current path formed between the source and drain on a semiconductor substrate, and a floating gate and a control gate that are connected over the semiconductor substrate with an insulator intervened between them. Further, the program operation of the flash memory cell is performed by making a source region of the memory cell and the semiconductor substrate, i.e., a bulk region grounded, applying a positive high voltage (program voltage; Vpp, for example 15V to 20V) to the control gate, and a voltage for a program (for example, 5 to 6V) to the drain of the memory cell, in order to generate hot carriers. The hot carriers are generated as electrons of the bulk region are accumulated on the floating gate due to an electric field of the high voltage (Vpp) applied to the control gate and charges supplied to the drain region are continuously accumulated.

The erase operation of the flash memory cell is simultaneously performed in a sector unit sharing the bulk region, by applying a negative high voltage (erase voltage; Vera, for example −10V) to the control gate and applying a given voltage (for example 5V) to the bulk region to cause fowler-nordheim tunneling (F-N tunneling). F-N tunneling causes the electrons accumulated on the floating gate to be discharged toward the source region, so that the flash memory cells has distribution of the erase threshold voltage ranging from about 1V to 3V.

The memory cell the threshold voltage of which was increased by the program operation looks turned off since current is prevented from being injected from the drain region to the source region upon the read operation. The cell the threshold voltage of which was lowered by the erase operation looks turned on since current is injected from the drain region to the source region.

FIG. 1 is a layout view showing a conventional NAND flash memory.

First to sixteenth cell regions Cell-1 to Cell-16 where cells are formed are positioned in a longitudinal direction with them spaced apart. Each of the cell regions is positioned to increase in a horizontal direction. Further, active regions A1 and A2 where the cells are formed are positioned in the longitudinal direction so that they intersect the respective cell regions. Drain select lines DSL1 and DSL2 are positioned at an upper side of the first cell region Cell-1 in the longitudinal direction wherein the drain select lines are positioned to increase in the horizontal direction. The drain select line DSL2 is also used in another upper array. Further, source select lines SSL1 and SSL2 are positioned at a lower side of the sixteenth cell region Cell-16 in the longitudinal direction wherein the source select lines are positioned to increase in the horizontal direction. The source select line SSL2 is also used in another lower array. Drain contacts D1 and D2 are formed at regions where between—the drain select lines DSL1 and DSL2 and the active regions A1 and A2 are intersecting. Source contact S1 and S2 are formed at regions where between—the source select lines SSL1 and SSL2 and the active regions A1 and A2 are intersecting.

FIG. 2 is a schematic cross-sectional view of the NAND flash memory taken along lines A—A in FIG. 1.

A field oxide film 20 is formed in a semiconductor substrate 10 wherein a triple well is formed. First to sixteenth cells c1 to c16 are formed at the semiconductor substrate 10 between the field regions 20. A transistor d for selecting a string is formed at the left side of the first cell c1 wherein a gate of the transistor d is connected to the drain select line DSL1. A transistor s for connecting to a common source line is formed at the right side of the sixteenth cell c16 wherein a gate of the transistor s is connected to the source select line SSL1.

FIG. 3 is a circuit diagram of the NAND flash memory shown in FIG. 1.

The first to sixteenth cells c1 to c16 are serially connected in a first string st1. A drain of the first cell c1 is connected to a first bit line b1 through the string select transistor d. A source of the sixteenth cell c16 is connected to a common source line S1 through the source select transistor s. A second string st2 has the same structure to the first string st1.

Upon a program operation, a voltage of 0V is applied to selected bit lines and Vcc is applied to non-selected bit lines. Further, a voltage (Vpgm) of, for example, 18V is applied to selected word lines, a voltage of, for example, 4.5V is applied to the drain select lines DSL and a voltage of 0V is applied to the source select lines SSL, respectively. A voltage (Vpass) of, for example, 10V is applied to non-selected word lines. The cells that are selected according to these voltage conditions are programmed. However, if Vcc is applied to non-selected strings, i.e., strings for which a program is inhibited so as to prevent program disturbance, Vpass is applied to non-selected word lines and Vpgm is applied to selected word lines, cells in the non-selected string perform a self-boosting operation. At this time, the voltage applied to the string is referred to as a channel boosting voltage, which is usually kept about 6V to 8V. Program disturbance depends on whether the channel voltage is high or low.

FIG. 4 is an equivalent circuit diagram of the non-selected string for calculating the channel boosting voltage.

Referring to FIGS. 3 and 4, the channel boosting voltage can be calculated as follows.

In case of a 16 cell array, the channel boosting voltage (Vch) is:

$$Vch = 15K(Vpass - Vchini) - Vth1 + K(Vpgm - Vchini - Vth2) + Vchini - Ileak*Tpw/Ctot$$

where, $K = Cono*Cox/(Ctot*(Cono+Cox)) = Cini/Ctot$

Vchini (transfer bit line voltage) = $Vcc - Vt_{13}$ select (threshold voltage of a select transistor)

Vth1: Threshold voltage of non-selected cells

Vth2: Threshold voltage of selected cells
Ileak: String leakage current
Cono: ONO capacitance
Cox: Capacitance of tunnel oxide films
Ctot: Total capacitance The boosting channel voltage calculated by the above equation is about 1 to 9V, which may differ depending on a program condition.

Such a boosting channel voltage plays an important role in deciding cell characteristics. This serves as an important factor in analyzing program disturbance. As this boosting channel voltage can be obtained only through calculation in the prior art, there is a significant difference between an actual value and a calculated value. In a real program, an electric field (Eox) of the tunnel oxide film that causes program disturbance in the program inhibit cell becomes Eox=(Vpgm−Vch+Vth0)Kg/Tox.

where, Vth0; Initial voltage
Kg: ONO coupling ratio
Tox: Thickness of a tunnel-oxide film As described above, the boosting channel voltage becomes an important factor of program disturbance as a variable of Eox. However, there is a problem that analysis of program disturbance is difficult since the method for measuring the boosting channel voltage is not so easy.

SUMMARY OF THE INVENTION

The present invention is contrived to solve the aforementioned problems. The present invention is directed to a method capable of measuring a boosting channel voltage of a NAND flash memory and the NAND flash memory for realizing the same.

According to one aspect of the present invention, there is provided a structure for testing a NAND flash memory, comprising a first string select transistor for controlling transfer of a voltage inputted via a first bit line; a first string having a plurality of flash memory cells, connected between the first string select transistor and a first source select transistor, and maintaining a program or erase state depending on a voltage inputted thereto; a second string select transistor for controlling transfer of a voltage inputted via a second bit line; a second string having a plurality of flash memory cells, connected between the second string select transistor and a second source select transistor, and maintaining the program or erase state depending on a voltage inputted thereto; and a measurement pad connected to a point where the first or second string select transistor and the flash memory cell are connected.

According to another aspect of the present invention, there is provided a method of testing a NAND flash memory, including the steps of providing the above-mentioned structure for testing the NAND flash memory, selecting the first or second string, wherein a voltage of 0V is applied to a selected string and Vcc is applied to a non-selected string, while applying a program voltage to control gates of all the flash memory cells in a column to be programmed in the selected string, a pass voltage to control gates of remaining flash memory cells, a first gate voltage to a gate of the string select transistor, and a voltage of 0V to the source select transistor; and measuring a voltage between the measurement pad and a source line.

BRIEF DESCRIPTION OF THE DRAWINGS

The above and other objects, features and advantages of the present invention will become apparent from the following description of preferred embodiments given in conjunction with the accompanying drawings, in which.

DETAILED DESCRIPTION OF PREFERRED EMBODIMENTS

The present invention will now be described in detail in connection with preferred embodiments with reference to accompanying drawings.

Figure 1:
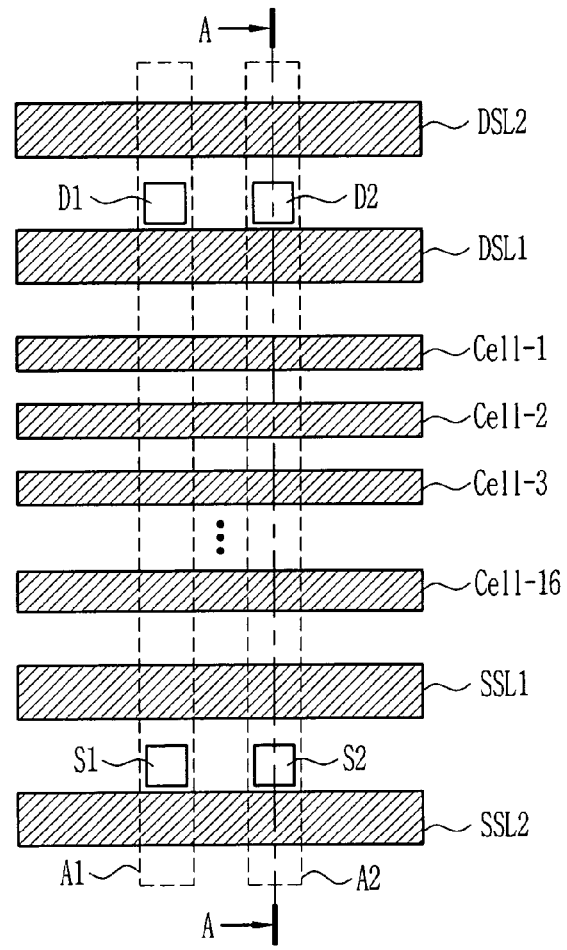
FIG. 1 is a layout view showing a conventional NAND flash memory.
Figure 2:
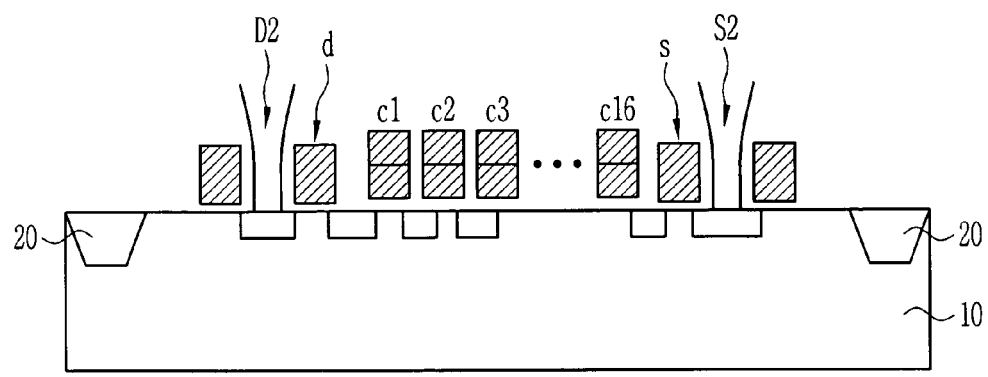
FIG. 2 is a cross-sectional view of the NAND flash memory taken along lines A—A in FIG. 1.
Figure 3:
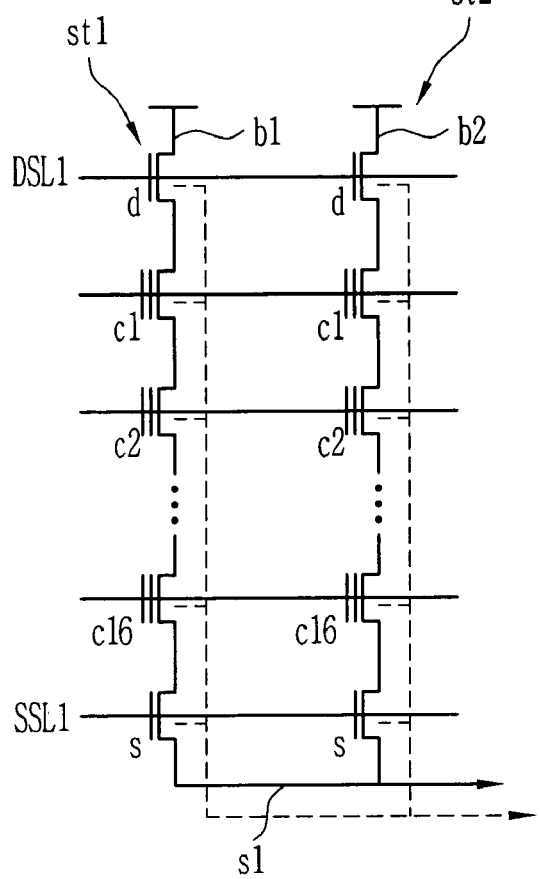
FIG. 3 is a circuit diagram of the NAND flash memory shown in FIG. 1.
Figure 4:
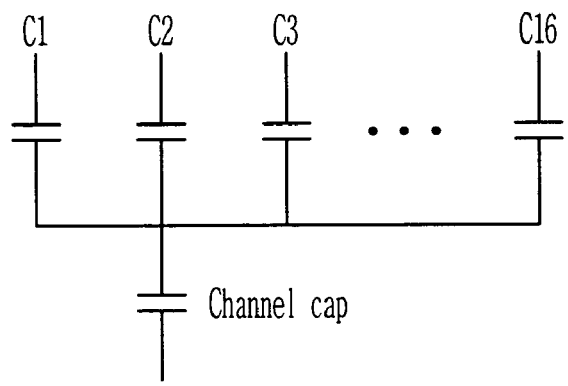
FIG. 4 is an equivalent circuit diagram illustrating a program-inhibit bit line in FIG. 3.
Figure 5:
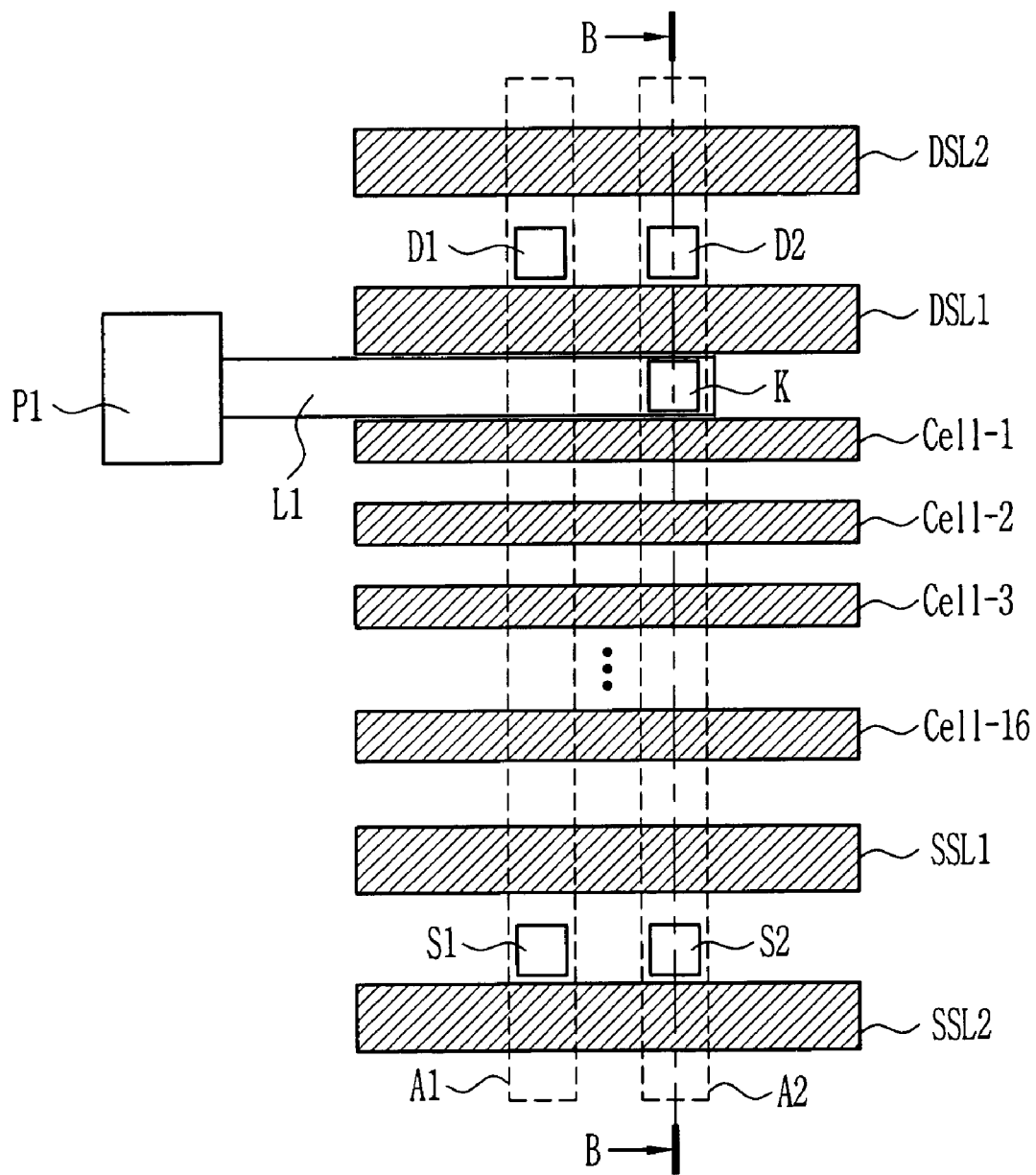
FIG. 5 is a layout view showing a NAND flash memory according to a first embodiment of the present invention.

FIG. 5 is a layout view showing a NAND flash memory according to a first embodiment of the present invention.

First to sixteenth cell regions Cell-1 to Cell-16 where cells are formed are positioned in a longitudinal direction with them spaced apart. Each of the cell regions is positioned to increase in a horizontal direction. Further, active regions A1 and A2 where the cells are formed are positioned in the longitudinal direction so that they intersect the respective cell regions. Drain select lines DSL1 and DSL2 are positioned at an upper side of the first cell region Cell-1 in the longitudinal direction wherein the drain select lines are positioned to increase in the horizontal direction. The drain select line DSL2 is also used in another upper array. Further, source select lines SSL1 and SSL2 are positioned at a lower side of the sixteenth cell region Cell-16 in the longitudinal direction wherein the source select lines are positioned to increase in the horizontal direction. The source select line SSL2 is also used in another lower array. Drain contacts D1 and D2 are formed at regions where between—the drain select lines DSL1 and DSL2 and the active regions A1 and A2 are intersecting. Source contact S1 and S2 are formed at regions where between—the source select lines SSL1 and SSL2 and the active regions A1 and A2 are intersecting.

Furthermore, a contact K for measuring a boosting channel voltage is formed at a region where between—the drain select line DSL1 and the first cell region Cell-1 and the second active region A2 are intersecting. Also, a metal line L1 for drawing out the contact K and a metal pad P1 are formed.

Figure 6:
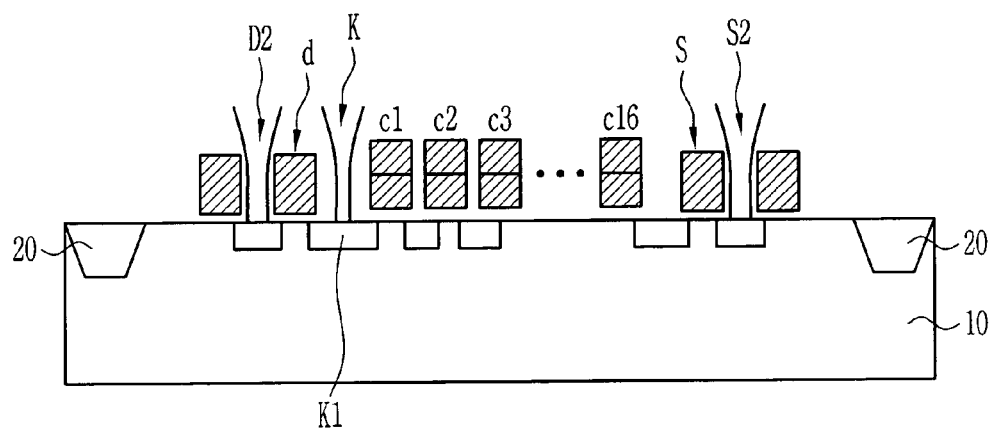
FIG. 6 is a cross-sectional view of the NAND flash memory taken along lines B—B in FIG. 5.

FIG. 6 is a cross-sectional view of the NAND flash memory taken along lines B—B in FIG. 5.

A field oxide film 20 is formed in a semiconductor substrate 10 wherein a triple well is formed. First to sixteenth cells c1 to c16 are formed at the semiconductor substrate 10 between the field regions 20. A transistor d for selecting a string is formed at the left side of the first cell c1 wherein a gate of the transistor d is connected to the drain select line DSL1. A transistor s for connecting to a common source line is formed at the right side of the sixteenth cell c16 wherein a gate of the transistor s is connected to the source select line SSL1.

In addition, a contact K for exposing a common diffusion region K1 of the first cell c1 and the string select transistor—the gate of the string select transistor is connected to the drain select line DSL1—is formed.

Figure 7:
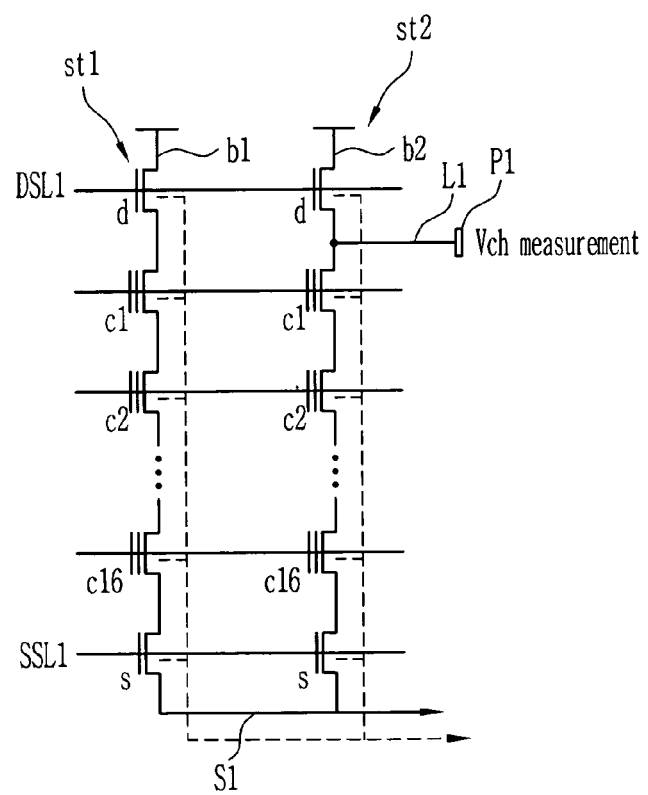
FIG. 7 is a circuit diagram of the NAND flash memory shown in FIG. 5.

FIG. 7 is a circuit diagram of the NAND flash memory shown in FIG. 5.

The first to sixteenth cells c1 to c16 are serially connected in a first string st1. A drain of the first cell c1 is connected to a first bit line b1 through the string select transistor d. A source of the sixteenth cell c16 is connected to a common source line S1 through the source select transistor s. A second string st2 has the same structure to the first string st1. Further, the metal line L1 is drawn out from a point where the string select transistor d of the bit line b2 for Which the program is inhibited and the first cell c1 are connected.

A method of measuring the channel boosting voltage will now be described.

For a program, a voltage of 0V is applied to selected bit lines and Vcc is applied to non-selected bit lines. Also, a voltage (Vpgm) of, for example, 18V is applied to selected word lines, a voltage of, for example, 4.5V is applied to the drain select lined DSL1 and a voltage of 0V is applied to the source select lined SSL1. In addition, a voltage (Vpass) of, for example, 10V is applied to non-selected word lined. In this state, if the voltage between the metal line L1 and the common source line is measured, the channel boosting voltage can be obtained.

Figure 8:
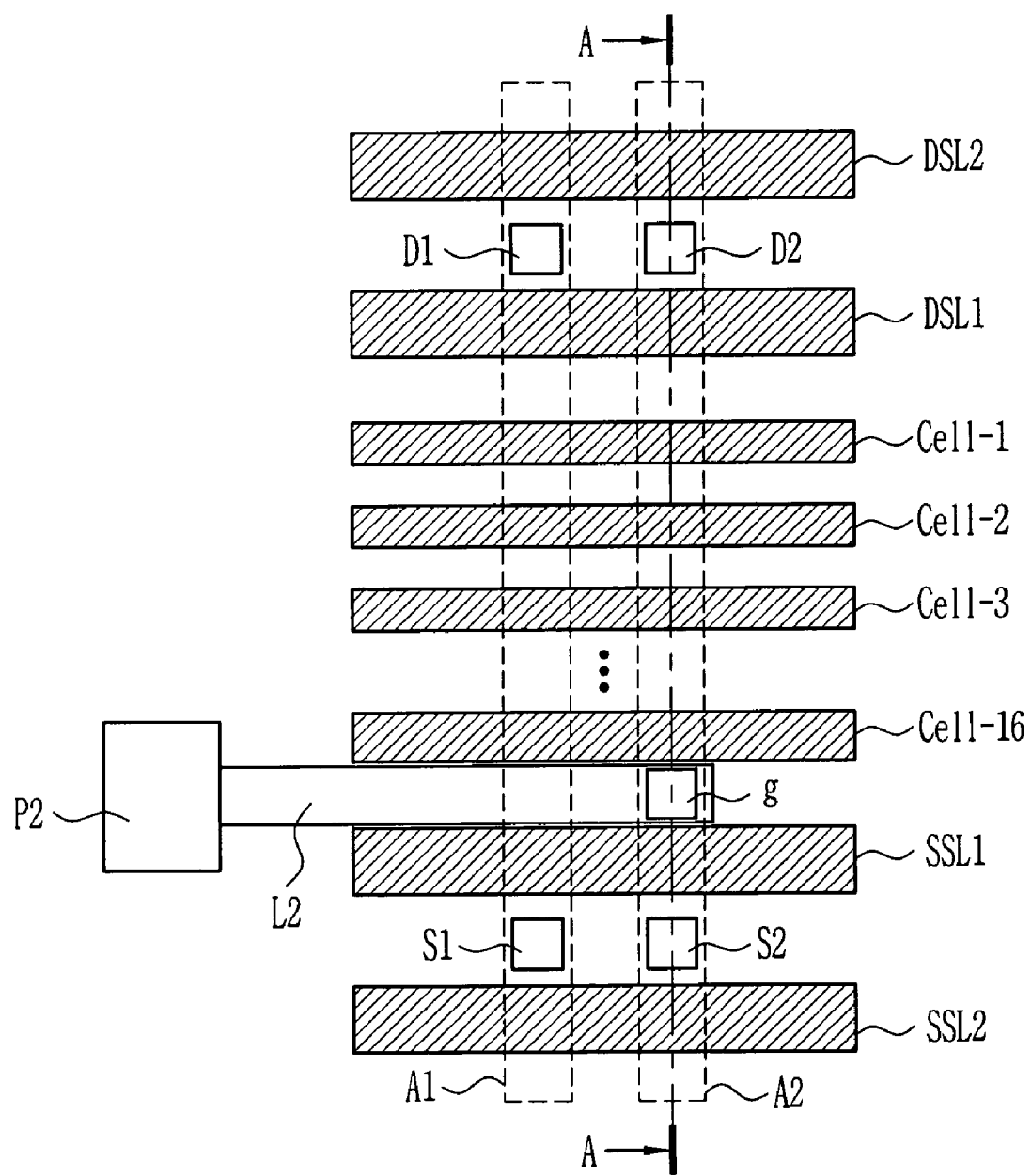
FIG. 8 is a layout view showing a NAND flash memory according to a second embodiment of the present invention.

FIG. 8 is a layout view showing a NAND flash memory according to a second embodiment of the present invention.

First to sixteenth cell regions Cell-1 to Cell-16 where cells are formed are positioned in a longitudinal direction with them spaced apart. Each of the cell regions is positioned to increase in a horizontal direction. Further, active regions A1 and A2 where the cells are formed are positioned in the longitudinal direction so that they intersect the respective cell regions. Drain select lines DSL1 and DSL2 are positioned at an upper side of the first cell region Cell-1 in the longitudinal direction wherein the drain select lines are positioned to increase in the horizontal direction. The drain select line DSL2 is also used in another upper array. Further, source select lines SSL1 and SSL2 are positioned at a lower side of the sixteenth cell region Cell-16 in the longitudinal direction wherein the source select lines are positioned to increase in the horizontal direction. The source select line SSL2 is also used in another lower array. Drain contacts D1 and D2 are formed at regions where between—the drain select lines DSL1 and DSL2 and the active regions A1 and A2 are intersecting. Source contact S1 and S2 are formed at regions where between—the source select lines SSL1 and SSL2 and the active regions A1 and A2 are intersecting.

Furthermore, a contact g for measuring a boosting channel voltage is formed at a region where between—the source select line SSL1 and the sixteenth cell region Cell-16 and the second active region A2 are intersecting. Also, a metal line L2 for drawing out the contact g and a metal pad P2 are formed.

Figure 9:
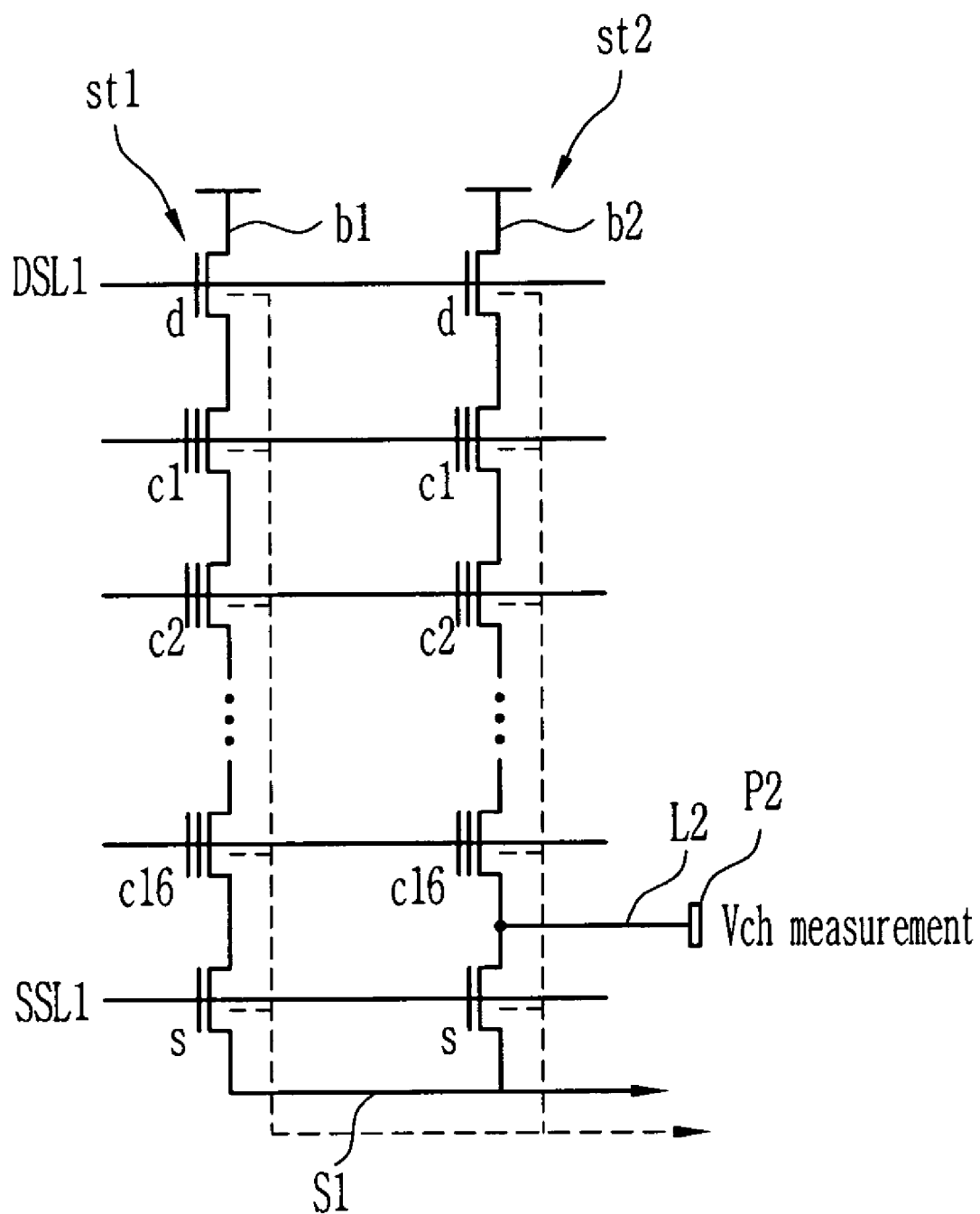
FIG. 9 is a circuit diagram of the NAND flash memory shown in FIG. 8.

FIG. 9 is a circuit diagram of the NAND flash memory shown in FIG. 8.

The first to sixteenth cells c1 to c16 are serially connected in a first string st1. A drain of the first cell c1 is connected to a first bit line b1 through the string select transistor d. A source of the sixteenth cell c16 is connected to a common source line S1 through the source select transistor s. A second string st2 has the same structure to the first string st1. Further, the metal line L2 is drawn out from a point where the source select transistor s of the bit line b2 for which a program is inhibited and the sixteenth cell c16 are connected.

A method of measuring the channel boosting voltage will now be described.

For a program, a voltage of 0V is applied to selected bit lines and Vcc is applied to non-selected bit lines. Also, a voltage (Vpgm) of, for example, 18V is applied to selected word lines, a voltage of, for example, 4.5V is applied to the drain select line DSL1 and a voltage of 0V is applied to the source select lines SSL. In addition, a voltage (Vpass) of, for example, 10V is applied to non-selected word lines. In this state, if the voltage between the metal line L2 and the common source line is measured, the channel boosting voltage can be obtained.

Figure 10:
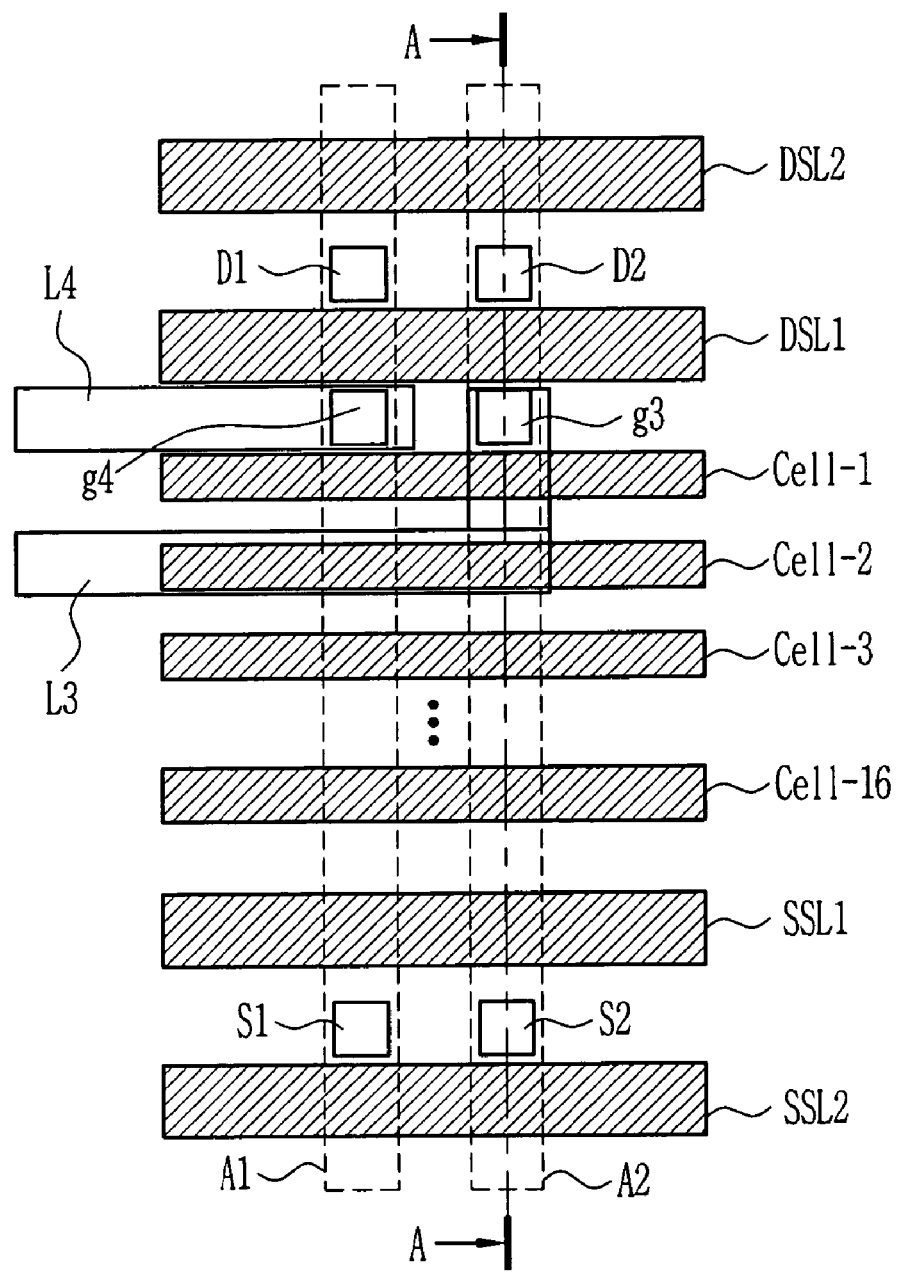
FIG. 10 is a layout view showing a NAND flash memory according to a third embodiment of the present invention.

FIG. 10 is a layout view showing a NAND flash memory according to a third embodiment of the present invention.

First to sixteenth cell regions Cell-1 to Cell-16 where cells are formed are positioned in a longitudinal direction with them spaced apart. Each of the cell regions is positioned to increase in a horizontal direction. Further, active regions A1 and A2 where the cells are formed are positioned in the longitudinal direction so that they intersect the respective cell regions. Drain select lines DSL1 and DSL2 are positioned at an upper side of the first cell region Cell-1 in the longitudinal direction wherein the drain select lines are positioned to increase in the horizontal direction. The drain select line DSL1 is also used in another upper array. Further, source select lines SSL1 and SSL2 are positioned at a lower side of the sixteenth cell region Cell-16 in the longitudinal direction wherein the source select lines are positioned to increase in the horizontal direction. The source select line SSL2 is also used in another lower array. Drain contacts D1 and D2 are formed at regions where between—the drain select lines DSL1 and DSL2 and the active regions A1 and A2 are intersecting. Source contact S1 and S2 are formed at regions where between—the source select lines SSL1 and SSL2 and the active regions A1 and A2 are intersecting.

Furthermore, a third contact g3 for measuring a boosting channel voltage is formed at a region where between—the drain select line DSL2 and the first cell region Cell-1 and the second active region A2 are intersecting. Also, a metal line L3 for drawing out the third contact g3 is formed.

Furthermore, a fourth contact g4 for measuring the boosting channel voltage is formed at a region where between—the drain select line DSL1 and the first cell region Cell-1 and the second active region A1 are intersecting. Also, a metal line L4 for drawing out the fourth contact g4 is formed.

Figure 11:
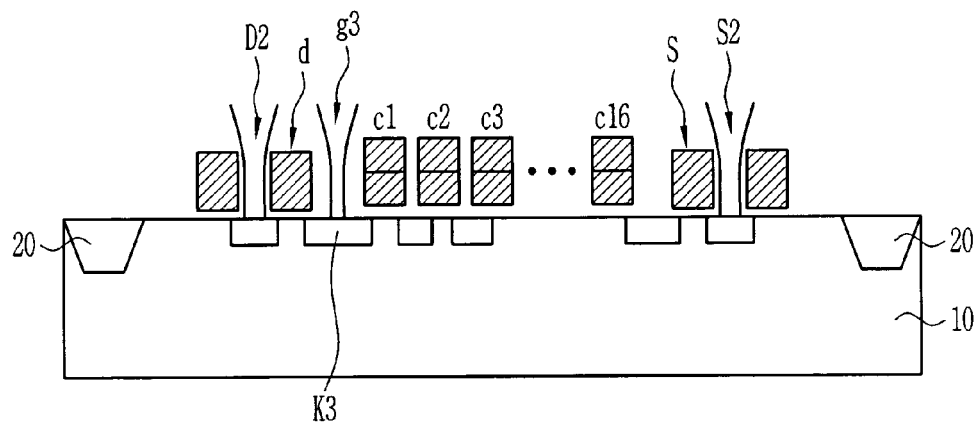
FIG. 11 is a cross-sectional view of the NAND flash memory taken along lines A—A in FIG. 10.

FIG. 11 is a cross-sectional view of the NAND flash memory taken along lines A—A in FIG. 10.

A field oxide film 20 is formed in a semiconductor substrate 10 wherein a triple well is formed. First to sixteenth cells c1 to c16 are formed at the semiconductor substrate 10 between the field regions 20. A transistor d for selecting a string is formed at the left side of the first cell c1 wherein a gate of the transistor d is connected to the drain select line DSL1. A transistor s for connecting to a common source line is formed at the right side of the sixteenth cell c16 wherein a gate of the transistor s is connected to the source select line SSL1.

Further, a contact g3 for exposing a common diffusion region K3 of the first cell c1 and the string select transistor—the gate of the string select transistor is connected to the drain select line DSL1—is formed.

Figure 12:
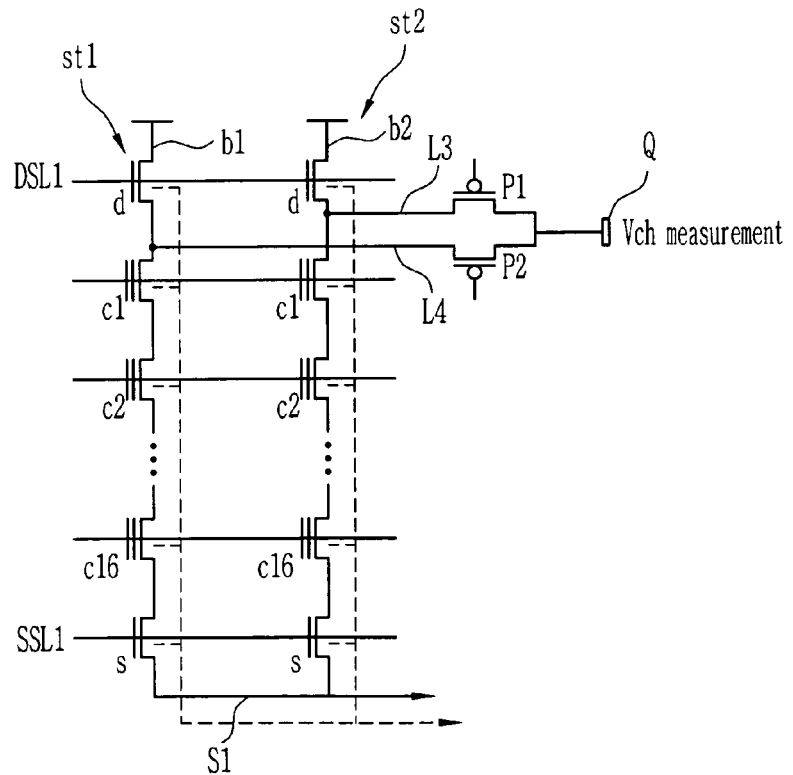
FIG. 12 is a circuit diagram of the NAND flash memory shown in FIG. 10.

FIG. 12 is a circuit diagram of the NAND flash memory shown in FIG. 10.

The first to sixteenth cells c1 to c16 are serially connected in a first string st1. A drain of the first cell c1 is connected to a first bit line b1 through the string select transistor d. A source of the sixteenth cell c16 is connected to a common source line S1 through the source select transistor s. A second string st2 has the same structure to the first string st1. Further, the metal line L3 is drawn out from a point where the string select transistor d of the bit line b2 for which a program is inhibited and the first cell c1 are connected. The metal line L4 is drawn out from a point where the string select transistor d of the bit line b1 that is selected for a program and the first cell c1. The metal line L3 is connected to a measurement pad Q through the first PMOS transistor P1 and the metal line L4 is connected to a measurement pad Q through the second PMOS transistor P2. Each of the first and second PMOS transistors P1 and P2 is turned on depending on a voltage applied to its gate electrode. At this time, a HVNOS transistor may replace the PMOS transistor.

A method of measuring the channel boosting voltage will now be described.

For a program, a voltage of 0V is applied to selected bit lines and Vcc is applied to non-selected bit lines. Also, a voltage (Vpgm) of, for example, 18V is applied to selected word lines, a voltage of, for example, 4.5V is applied to the drain select line DSL1 and a voltage of 0V is applied to the source select lines SSL. In addition, a voltage (Vpass) of, for example, 10V is applied to non-selected word lines. In this state, if the voltage between the measurement pad Q2 and the common source line is measured in a state where the first PMOS transistor P1 is turned off while the second PMOS transistor P2 is turned on, the channel boosting voltage can be obtained.

Figure 13:
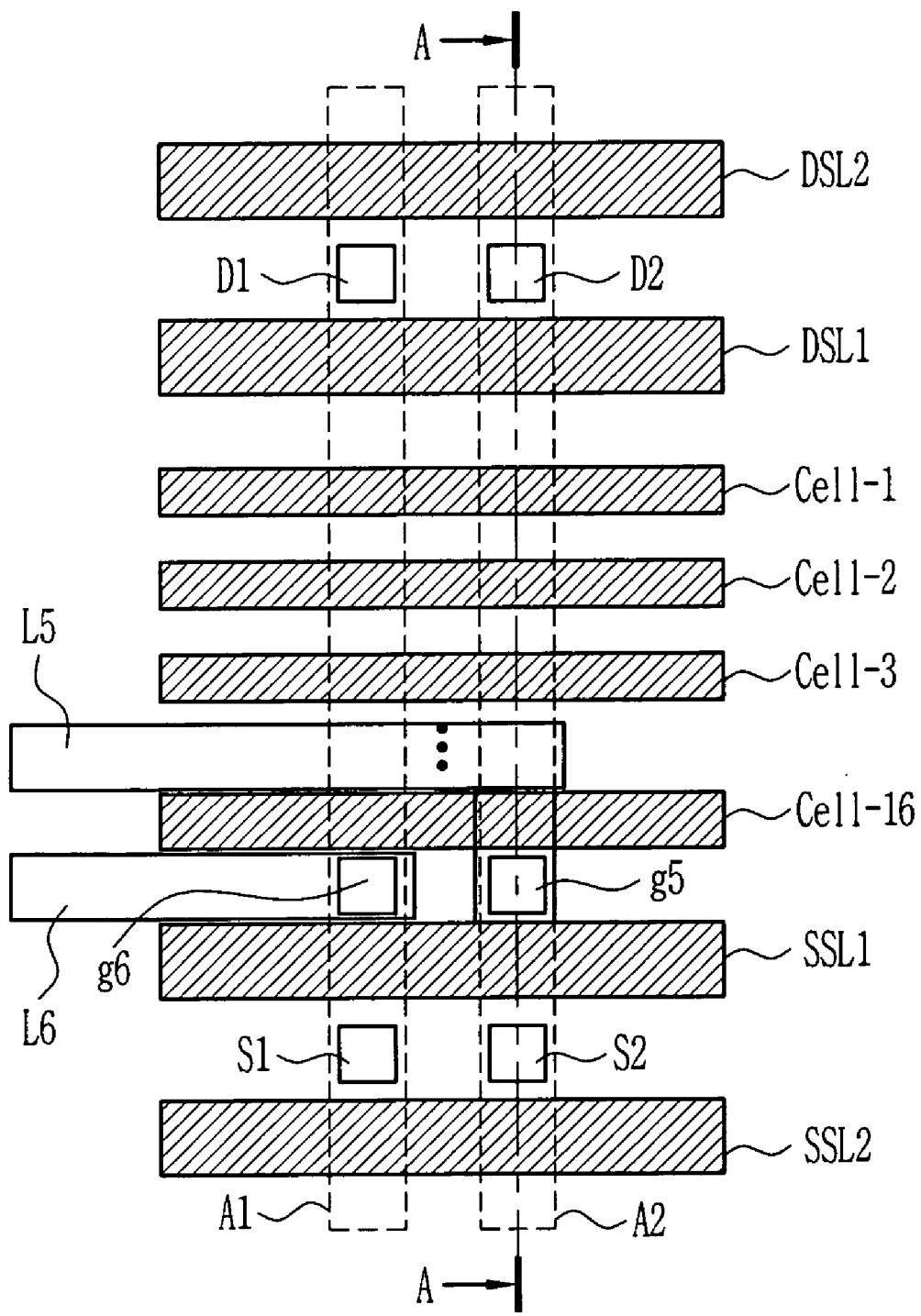
FIG. 13 is a layout view showing a NAND flash memory according to a fourth embodiment of the present invention.

FIG. 13 is a layout view showing a NAND flash memory according to a fourth embodiment of the present invention.

First to sixteenth cell regions Cell-1 to Cell-16 where cells are formed are positioned in a longitudinal direction with them spaced apart. Each of the cell regions is positioned to increase in a horizontal direction. Further, active regions A1 and A2 where the cells are formed are positioned in the longitudinal direction so that they intersect the respective cell regions. Drain select lines DSL1 and DSL2 are positioned at an upper side of the first cell region Cell-1 in the longitudinal direction wherein the drain select lines are positioned to increase in the horizontal direction. The drain select line DSL2 is also used in another upper array. Further, source select lines SSL1 and SSL2 are positioned at a lower side of the sixteenth cell region Cell-16 in the longitudinal direction wherein the source select lines are positioned to increase in the horizontal direction. The source select line SSL2 is also used in another lower array. Drain contacts D1 and D2 are formed at regions where between—the drain select lines DSL1 and DSL2 and the active regions A1 and A2 are intersecting. Source contact S1 and S2 are formed at regions where between—the source select lines SSL1 and SSL2 and the active regions A1, and A2 are intersecting.

Furthermore, a contact g5 for measuring a boosting channel voltage is formed at a region where between—the source select line SSL1 and the sixteenth cell region Cell-16 and the second active region A2 are intersecting. A metal line L5 for drawing out the contact g5 is formed. Also, a contact g6 for measuring the boosting channel voltage is formed at a region where between—the source select line SSL1 and the sixteenth cell region Cell-16 and the second active region A1 are intersecting. A metal line L6 for drawing out the contact g6 is formed.

Figure 14:
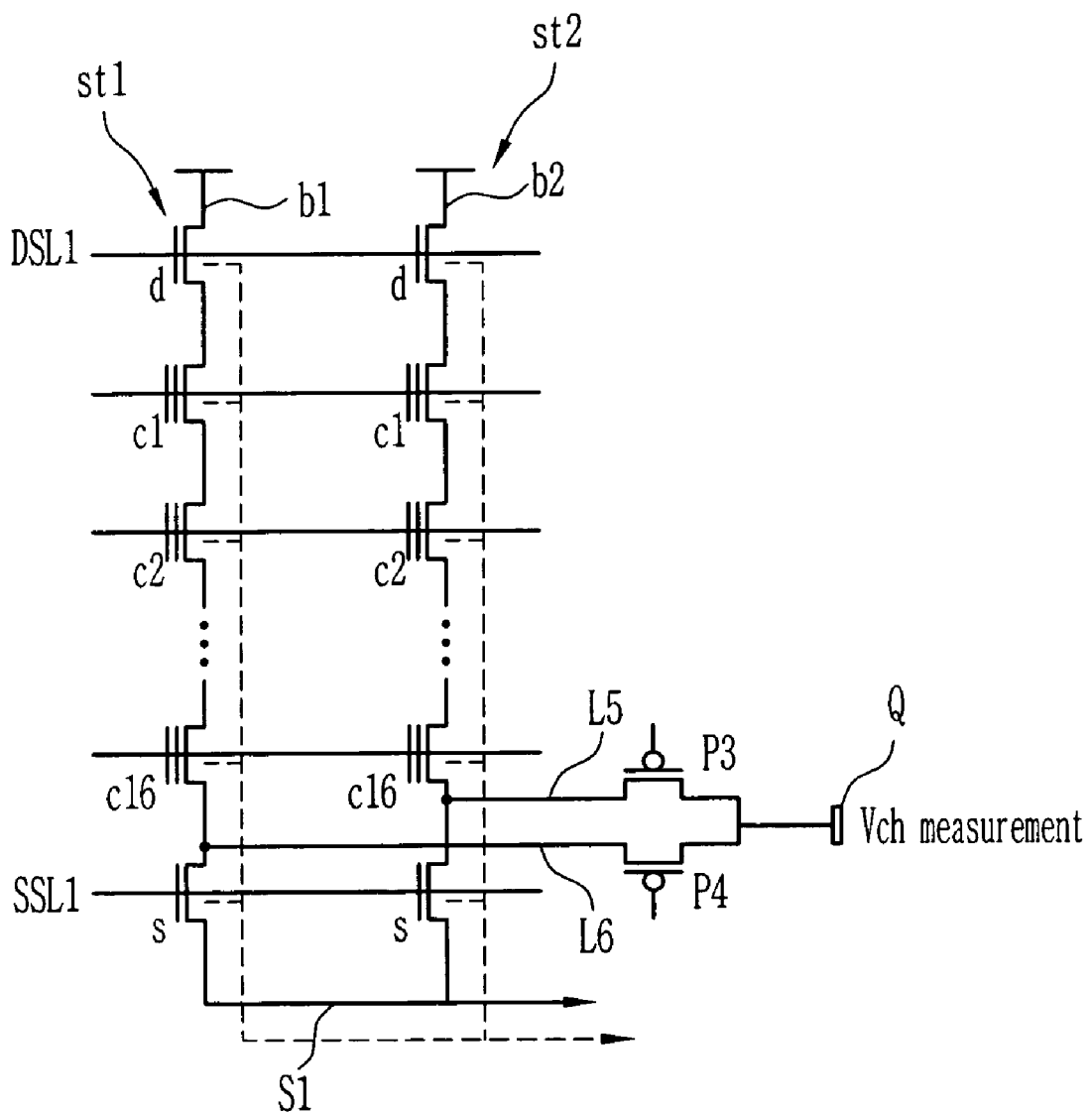
FIG. 14 is a circuit diagram of the NAND flash memory shown in FIG. 13.

FIG. 14 is a circuit diagram of the NAND flash memory shown in FIG. 13.

The first to sixteenth cells c1 to c16 are serially connected in a first string st1. A drain of the first cell c1 is connected to a first bit line b1 through the string select transistor d. A source of the sixteenth cell c16 is connected to a common source line S1 through the source select transistor s. A second string st2 has the same structure to the first string st1. Further, the metal line L5 is drawn out from a point where the source select transistor s of the bit line b2 for which a program is inhibited and the sixteenth cell c16 are connected. The metal line L6 is drawn out from a point where the source select transistor s of the bit line b1 that is selected for a program and the sixteenth cell c1 are connected. The metal line L5 is connected to a measurement pad Q through the first PMOS transistor P3. The metal line L6 is connected to the measurement pad Q through the second PMOS transistor P4. Each of the first and second PMOS transistors P3 and P4 is turned on depending on a voltage applied to its gate electrode.

A method of measuring the channel boosting voltage will now be described.

For a program, a voltage of 0V is applied to selected bit lines and Vcc is applied to non-selected bit lines. Also, a voltage (Vpgm) of, for example, 18V is applied to selected word lines, a voltage of, for example, 4.5V is applied to the drain select line DSL1 and a voltage of 0V is applied to the source select lines SSL. In addition, a voltage (Vpass) of, for example, 10V is applied to non-selected word lines. In this state, if the voltage between the measurement pad Q2 and the common source line is measured in a state where the first PMOS transistor P3 is turned off while the second PMOS transistor P4 is turned on, the channel boosting voltage can be obtained.

At this time, a HVNMOS transistor may replace the first and second PMOS transistors.

According to present invention described above, it is possible to simply measure the boosting channel voltage of the NAND flash memory.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:

1. A structure for testing a NAND flash memory, comprising:
   a first string select transistor for controlling transfer of a voltage inputted via a first bit line;
   a first string having a plurality of flash memory cells, connected between the first string select transistor and a first source select transistor, and maintaining a program state or an erase state depending on a voltage inputted thereto;

a second string select transistor for controlling transfer of a voltage inputted via a second bit line;

a second string having a plurality of flash memory cells, connected between the second string select transistor and a second source select transistor, and maintaining the program state or the erase state depending on a voltage inputted thereto; and a measurement pad connected to a point where the first or the second string select transistor and an adjacent flash memory cell are connected.

2. A structure for testing a NAND flash memory, comprising:

a first string select transistor for controlling transfer of a voltage inputted via a first bit line;

a first string having a plurality of flash memory cells, connected between the first string select transistor and a first source select transistor, and maintaining a program state or an erase state depending on a voltage inputted thereto;

a second string select transistor for controlling transfer of a voltage inputted via a second bit line;

a second string having a plurality of flash memory cells, connected between the second string select transistor and a second source select transistor, and maintaining the program state or the erase state depending on a voltage inputted thereto; and a measurement pad connected to a point where the first or the second source select transistor and an adjacent flash memory cell are connected.

3. A method of testing a NAND flash memory, comprising the steps of:

providing structure for testing the NAND flash memory, the structure comprising:
 a first string select transistor for controlling transfer of a voltage inputted via a first bit line;
 a first string having a plurality of flash memory cells, connected between the first string select transistor and a first source select transistor, and maintaining a program state or an erase state depending on a voltage inputted thereto;
 a second string select transistor for controlling transfer of a voltage inputted via a second bit line;
 a second string having a plurality of flash memory cells, connected between the second string select transistor and a second source select transistor, and maintaining the program state or the erase state depending on a voltage inputted thereto; and
 a measurement pad connected to a point where the first or the second string select transistor and an adjacent flash memory cell are connected;

selecting the first or the second string, wherein a voltage of 0V is applied to a selected string and Vcc is applied to a non-selected string, while applying a program voltage to control gates of all the flash memory cells in a column to be programmed in the selected string, a pass voltage to control gates of remaining flash memory cells, a first gate voltage to a gate of the string select transistor, and a voltage of 0V to the source select transistor; and measuring a voltage between the measurement pad and a common source line.

4. A method of testing a NAND flash memory, comprising the steps of:

providing structure for testing the NAND flash memory, the structure comprising:
 a first string select transistor for controlling transfer of a voltage inputted via a first bit line;
 a first string having a plurality of flash memory cells, connected between the first string select transistor and a first source select transistor, and maintaining a program state or an erase state depending on a voltage inputted thereto;
 a second string select transistor for controlling transfer of a voltage inputted via a second bit line;
 a second string having a plurality of flash memory cells, connected between the second string select transistor and a second source select transistor, and maintaining the program state or the erase state depending on a voltage inputted thereto; and
 a measurement pad connected to a point where the first or the second source select transistor and an adjacent flash memory cell are connected;

selecting the first or second string, wherein a voltage of 0V is applied to a selected string and Vcc is applied to a non-selected string, while applying a program voltage to control gates of all the flash memory cells in a column to be programmed in the selected string, a pass voltage to control gates of remaining flash memory cells, a first gate voltage to a gate of the string select transistor, and a voltage of 0V to the source select transistor; and measuring a voltage between the measurement pad and a common source line.

5. A structure for testing a NAND flash memory, comprising:

a first string select transistor for controlling transfer of a voltage inputted via a first bit line;

a first string having a plurality of flash memory cells, connected between the first string select transistor and a first source select transistor, and maintaining a program state or an erase state depending on a voltage inputted thereto;

a second string select transistor for controlling transfer of a voltage inputted via a second bit line;

a second string having a plurality of flash memory cells, connected between the second string select transistor and a second source select transistor, and maintaining the program state or the erase state depending on a voltage inputted thereto;

a first switching device connected between a point where the first string select transistor and a flash memory cell adjacent to the first string select transistor are connected and a first measurement pad; and a second switching device connected between a point where the second string select transistor and a flash memory cell adjacent to the second string select transistor are connected and a second measurement pad.

6. The structure as claimed in claim 5, wherein each of the first and second switching devices includes a NMOS transistor or a HVNMOS transistor.

7. A structure for testing a NAND flash memory, comprising:

a first string select transistor for controlling transfer of a voltage inputted via a first bit line;

a first string having a plurality of flash memory cells, connected between the first string select transistor and a first source select transistor, and maintaining a program state or an erase state depending on a voltage inputted thereto;

a second string select transistor for controlling transfer of a voltage inputted via a second bit line;

a second string having a plurality of flash memory cells, connected between the second string select transistor and a second source select transistor, and maintaining the program state or the erase state depending on a voltage inputted thereto;

a first switching device connected between a point where the first source select transistor and a flash memory cell adjacent to the first source select transistor are connected and a first measurement pad; and a second switching device connected between a point where the second source select transistor and a flash memory cell adjacent to the second source select transistor are connected and a second measurement pad.

8. The structure as claimed in claim 7, wherein each of the first and second switching devices includes a NMOS transistor or a HVNMOS transistor.

9. A method of testing a NAND flash memory, comprising the steps of:

providing structure for testing the NAND flash memory, the structure comprising:

a first string select transistor for controlling transfer of a voltage inputted via a first bit line;

a first string having a plurality of flash memory cells, connected between the first string select transistor and a first source select transistor, and maintaining a program state or an erase state depending on a voltage inputted thereto;

a second string select transistor for controlling transfer of a voltage inputted via a second bit line;

a second string having a plurality of flash memory cells, connected between the second string select transistor and a second source select transistor, and maintaining the program state or the erase state depending on a voltage inputted thereto, a first switching device connected between a point where the first string select transistor and a flash memory cell adjacent to the first string select transistor are connected and a first measurement pad; and a second switching device connected between a point where the second string select transistor and a flash memory cell adjacent to the second string select transistor are connected and a second measurement pad;

selecting the first or the second string, wherein a voltage of 0V is applied to a selected string and Vcc is applied to a non-selected string, while applying a program voltage to control gates of all the flash memory cells in a column to be programmed in the selected string, a pass voltage to control gates of remaining flash memory cells, a first gate voltage to a gate of the string select transistor, and a voltage of 0V to the source select transistor;

turning on the switching device connected to the selected string; and measuring a voltage between the measurement pad and a source line.

10. A method of testing a NAND flash memory, comprising the steps of:

providing structure for testing the NAND flash memory, the structure comprising:

a first string select transistor for controlling transfer of a voltage inputted via a first bit line;

a first string having a plurality of flash memory cells, connected between the first string select transistor and a first source select transistor, and maintaining a program state or an erase state depending on a voltage inputted thereto;

a second string select transistor for controlling transfer of a voltage inputted via a second bit line;

a second string having a plurality of flash memory cells, connected between the second string select transistor and a second source select transistor, and maintaining the program state or the erase state depending on a voltage inputted thereto;

a first switching device connected between a point where the first source select transistor and a flash memory cell adjacent to the first source select transistor are connected and a first measurement pad; and a second switching device connected between a point where the second source select transistor and a flash memory cell adjacent to the second source select transistor are connected and a second measurement pad;

selecting the first or second string, wherein a voltage of 0V is applied to a selected string and Vcc is applied to a non-selected string, while applying a program voltage to control gates of all the flash memory cells in a column to be programmed in the selected string, a pass voltage to control gates of remaining flash memory cells, a first gate voltage to a gate of the string select transistor, and a voltage of 0V to the source select transistor;

turning on the switching device connected to the selected string; and measuring a voltage between the measurement pad and a source line.

* * * * *

UNITED STATES PATENT AND TRADEMARK OFFICE
CERTIFICATE OF CORRECTION

PATENT NO. : 7,031,190 B2  Page 1 of 1
APPLICATION NO. : 10/737571
DATED : April 18, 2006
INVENTOR(S) : Keun W. Lee It is certified that error appears in the above-identified patent and that said Letters Patent is hereby corrected as shown below:

In the Claims:

At Column 9, line 67, claim 4 "line:" should be -- line; --.

At Column 11, line 32, claim 9 "thereto," should be -- thereto; --.

Signed and Sealed this

Seventeenth Day of May, 2011

David J. Kappos
*Director of the United States Patent and Trademark Office*